United States Patent
Gupta et al.

(10) Patent No.: US 9,817,713 B2
(45) Date of Patent: Nov. 14, 2017

(54) DISTRIBUTED CACHE SYSTEM UTILIZING MULTIPLE ERASURE CODES

(71) Applicant: International Business Machines Corporation, Armonk, NY (US)

(72) Inventors: Aayush Gupta, San Jose, CA (US); Mohit Saxena, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 16 days.

(21) Appl. No.: 15/016,014

(22) Filed: Feb. 4, 2016

(65) Prior Publication Data

US 2017/0228282 A1 Aug. 10, 2017

(51) Int. Cl.
| | |
|---|---|
| *G11C 29/00* | (2006.01) |
| *G06F 11/10* | (2006.01) |
| *G06F 12/0802* | (2016.01) |
| *H03M 13/15* | (2006.01) |

(52) U.S. Cl.
CPC ...... *G06F 11/1064* (2013.01); *G06F 12/0802* (2013.01); *H03M 13/154* (2013.01); *G06F 2212/1032* (2013.01)

(58) Field of Classification Search
None
See application file for complete search history.

(56) References Cited

U.S. PATENT DOCUMENTS

| | | | |
|---|---|---|---|
| 7,979,641 B2 | 7/2011 | He et al. | |
| 8,055,845 B2 | 11/2011 | Soules et al. | |
| 2007/0192542 A1 | 8/2007 | Frolund et al. | |
| 2008/0270704 A1 | 10/2008 | He et al. | |
| 2008/0270878 A1 | 10/2008 | He et al. | |
| 2009/0103723 A1* | 4/2009 | Martin | H04L 9/0894 380/44 |
| 2010/0083069 A1* | 4/2010 | Wylie | H03M 13/01 714/752 |
| 2014/0208022 A1* | 7/2014 | Gordon | G06F 11/1076 711/114 |
| 2015/0121169 A1* | 4/2015 | Iliadis | G06F 11/1076 714/766 |
| 2016/0011939 A1* | 1/2016 | Luby | G06F 11/1076 714/764 |
| 2016/0062689 A1* | 3/2016 | Cherubini | G06F 3/0619 711/159 |

(Continued)

OTHER PUBLICATIONS

Chen, Y-L. et al., "Regenerating Code Based P2P Storage Scheme with Caching", Proceedings of 2009 Fourth International Conference on Computer Sciences and Convergence Information Technology (ICCIT'09), Nov. 24-26, 2009, pp. 927-932, IEEE, United States.

(Continued)

*Primary Examiner* — Daniel McMahon
(74) *Attorney, Agent, or Firm* — Sherman IP LLP; Kenneth L. Sherman; Hemavathy Perumal (57) ABSTRACT

One embodiment provides a method comprising, for at least one data block, selecting an erasure code from a plurality of erasure codes based on at least one property of the at least one data block and information relating to a data cache, and encoding, utilizing at least one hardware processor, the at least one data block with the selected erasure code. The information relating to the data cache includes cache space usage of the data cache.

20 Claims, 9 Drawing Sheets

(56) References Cited

U.S. PATENT DOCUMENTS

2016/0211869 A1* 7/2016 Blaum ................ H03M 13/373
2016/0217039 A1* 7/2016 Reinart ............. G06F 17/30082
2016/0294419 A1* 10/2016 Sandell ................ H03M 13/35
2017/0033806 A1* 2/2017 Arslan ................ H03M 13/356

OTHER PUBLICATIONS

Zeng, T. et al., "Router Supported Data Regeneration Protocols in Distributed Storage Systems", Proceedings of 2011 Third International Conference on Ubiquitous and Future Networks (ICUFN'11), Jun. 15-17, 2011, pp. 315-320, IEEE, United States.

Anonymous, "Method for I/O performance improvement in Erasure Code environment", Jun. 10, 2013, pp. 1-8, IP.COM, United States [IP.COM No. 000228152].

Linux Defenders et al., "Reliable, Scalable, and High-Performance Distributed Storage: Data Distribution", Feb. 19, 2014, pp. 1-9, IP.COM, United States [IP.COM No. 000234958].

* cited by examiner

Select An Erasure Code From A Plurality of Erasure Codes Based On At Least One Property Of A Data Block And Cache Space Usage Of A Data Cache ⎫ 401

↓

Encode The Data Block With The Selected Erasure Code ⎫ 402

DISTRIBUTED CACHE SYSTEM UTILIZING MULTIPLE ERASURE CODES

The present invention generally relates to distributed cache systems, and more particularly, to a distributed cache system utilizing multiple erasure codes.

BACKGROUND

Different types of cache data have different reliability (i.e., fault tolerance), storage overhead (i.e., storage efficiency) and recovery cost requirements. Existing cache systems utilize a single erasure code (e.g., Reed Solomon) or replication technique (e.g., three-way replication) to optimize either reliability and/or storage overhead. Existing single erasure-coded cache systems trade recovery costs for storage overhead and/or reliability.

SUMMARY

One embodiment provides a method comprising, for at least one data block, selecting an erasure code from a plurality of erasure codes based on at least one property of the at least one data block and information relating to a data cache, and encoding, utilizing at least one hardware processor, the at least one data block with the selected erasure code. The information relating to the data cache includes cache space usage of the data cache.

These and other aspects, features and advantages of the invention will be understood with reference to the drawing figures, and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention generally relates to distributed cache systems, and more particularly, to a distributed cache system utilizing multiple erasure codes. One embodiment provides a method comprising, for at least one data block, selecting an erasure code from a plurality of erasure codes based on at least one property of the at least one data block and information relating to a data cache, and encoding, utilizing at least one hardware processor, the at least one data block with the selected erasure code. The information relating to the data cache includes cache space usage of the data cache.

Figure 1:
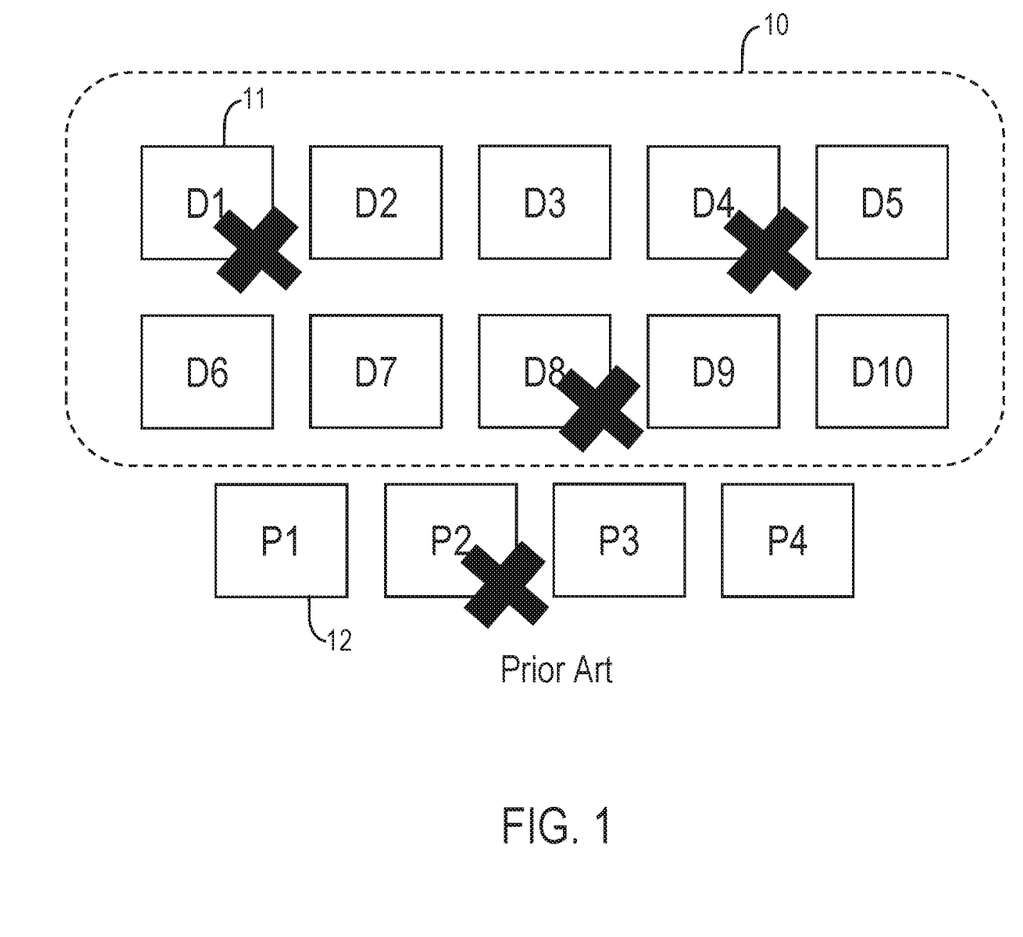
FIG. 1 illustrates a Reed Solomon (10, 4) erasure code utilized by a cache system.

FIG. 1 illustrates a Reed Solomon (10, 4) erasure code utilized by a cache system. As shown in FIG. 1, a stripe 10 of data in a cache system utilizing the Reed Solomon (10, 4) erasure code comprises ten data blocks 11, such as data blocks D1, D2, . . . , and D10. Four corresponding parity blocks 12 are computed for the stripe 10, such as parity blocks P1, P2, P3 and P4. The Reed Solomon (10, 4) erasure code tolerates up to four missing blocks for the stripe 10. For example, the stripe 10 is recoverable even if parity block P2 and data blocks D1, D4 and D8 are missing. Resulting storage overhead for the stripe is about 1.4×. For a single failure, the Reed Solomon (10, 4) erasure code needs any ten blocks over network from other nodes to recover.

In this specification, let the term "cache data block" denote a data block present in a cache. Let the term "clean block" denote a data block that has at least one corresponding backup copy maintained on at least one storage back-end device. Let the term "dirty block" denote a data block that does not have at least one corresponding backup copy maintained on at least one storage back-end device (i.e., the data block is only present in a cache). Let the term "cache insertion" denote a process of inserting at least one block (i.e., at least one data and/or parity block) into a cache. Let the term "destaging" denote a process of generating at least one backup copy of at least one block (i.e., at least one data and/or parity block) present in a cache, wherein the at least one backup copy is generated for storage on at least one storage back-end device. Let the term "hot block" denote a cache data block that is frequently accessed. Let the term "cold block" denote a cache data block that is infrequently accessed. Let the term "data temperature" denote a frequency at which a cache data block is accessed (i.e., whether the cache data block is a cold block or a hot block).

Embodiments of the invention provide a cache system that utilizes multiple erasure codes by classifying cache data, thereby providing the best of reliability (i.e., data redundancy), storage efficiency and recovery performance. The multiple erasure codes provide different reliability and storage overhead requirements. As described in detail later herein, the cache system is configured to classify a data block as at least one of the following: (1) a clean block or a dirty block, and (2) a hot block or a cold block. In response to a destaging of a cache data block, a cache insertion of a data block, or a change in data temperature of a cache data block, the cache system determines an appropriate erasure code based on how the data block is classified (i.e., the cache data block is clean or dirty, and/or hot or cold), and encodes the data block using the erasure code determined. Further, the cache system is configured to convert, during destaging or cache insertion, a cache data block between different erasure codes using upcoding or downcoding techniques. Therefore, the cache system provides adaptive coding with multiple erasure codes to provide increased recovery performance, increased reliability (i.e., increased data redundancy) and decreased storage overhead (i.e., increased storage efficiency).

Figure 2:
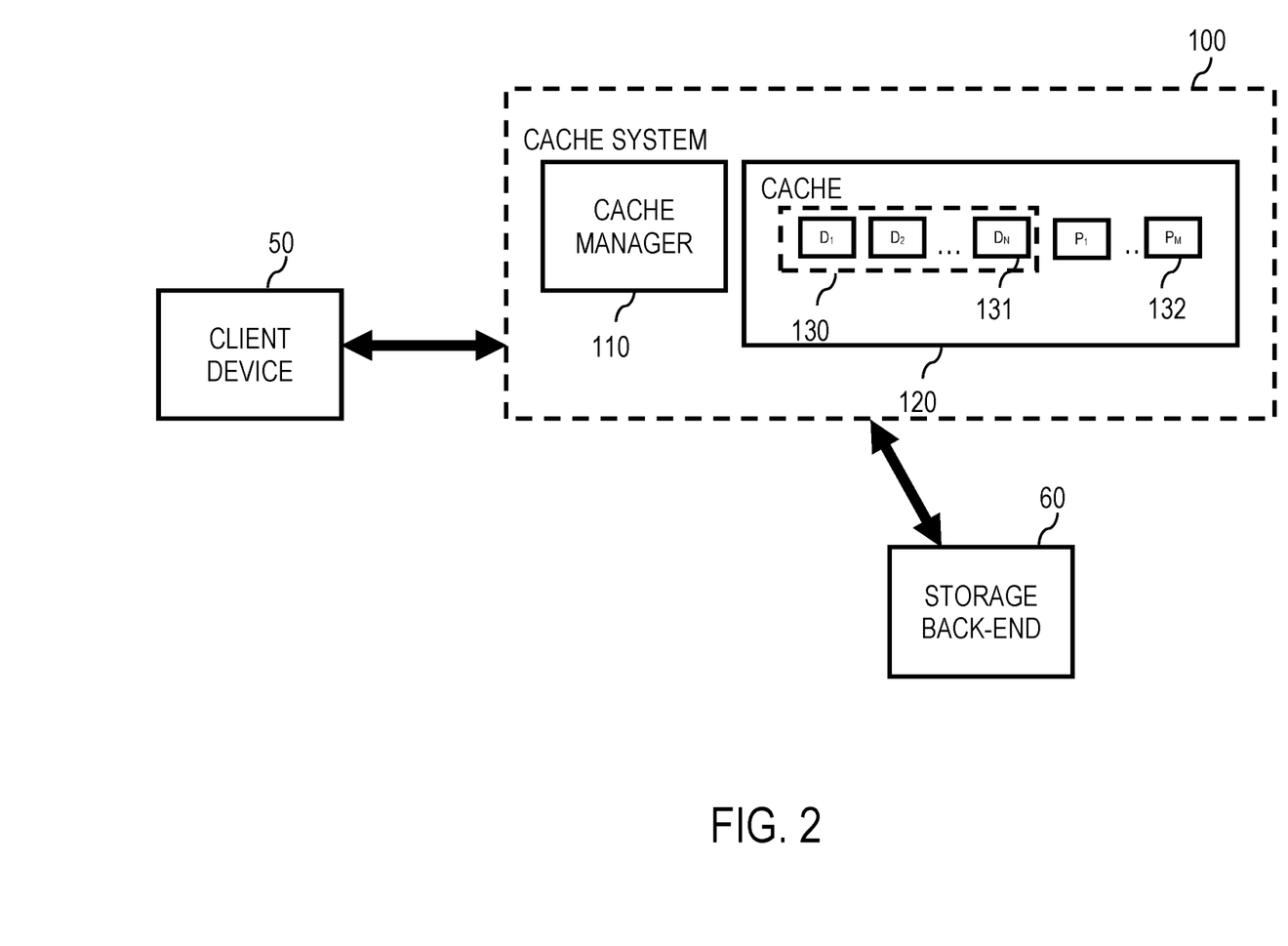
FIG. 2 illustrates an example cache system utilizing multiple erasure codes, in accordance with an embodiment of the invention.

FIG. 2 illustrates an example cache system 100 utilizing multiple erasure codes, in accordance with an embodiment of the invention. The cache system 100 comprises a cache manager 110 and a data cache 120. The data cache 120 maintains one or more stripes 130 of data. Each stripe 130 comprises one or more data blocks 131 (e.g., $D_1, \ldots, D_N$), and has one or more corresponding parity blocks 132 (e.g., $P_1, \ldots, P_M$). As described in detail later herein, the stripes 130 may be encoded with different erasure codes.

An electronic client device 50 (e.g., a personal computer or a mobile device such as a laptop computer, a tablet, a mobile phone, etc.) exchanges data with the cache system 100 over a connection (e.g., a wireless connection, a wired connection, or a combination of the two). For example, in response to receiving a request for a piece of data from the client device 50, the cache system 100 searches the data cache 120. If the piece of data requested is available in the data cache 120, the cache system 100 returns the piece of data requested to the client device 50; otherwise, the cache system 100 forwards the request to at least one storage back-end device 60 (e.g., a remote server).

The cache system 100 may be implemented on a single electronic device (e.g., a server) or as a distributed computing environment.

Figure 3:
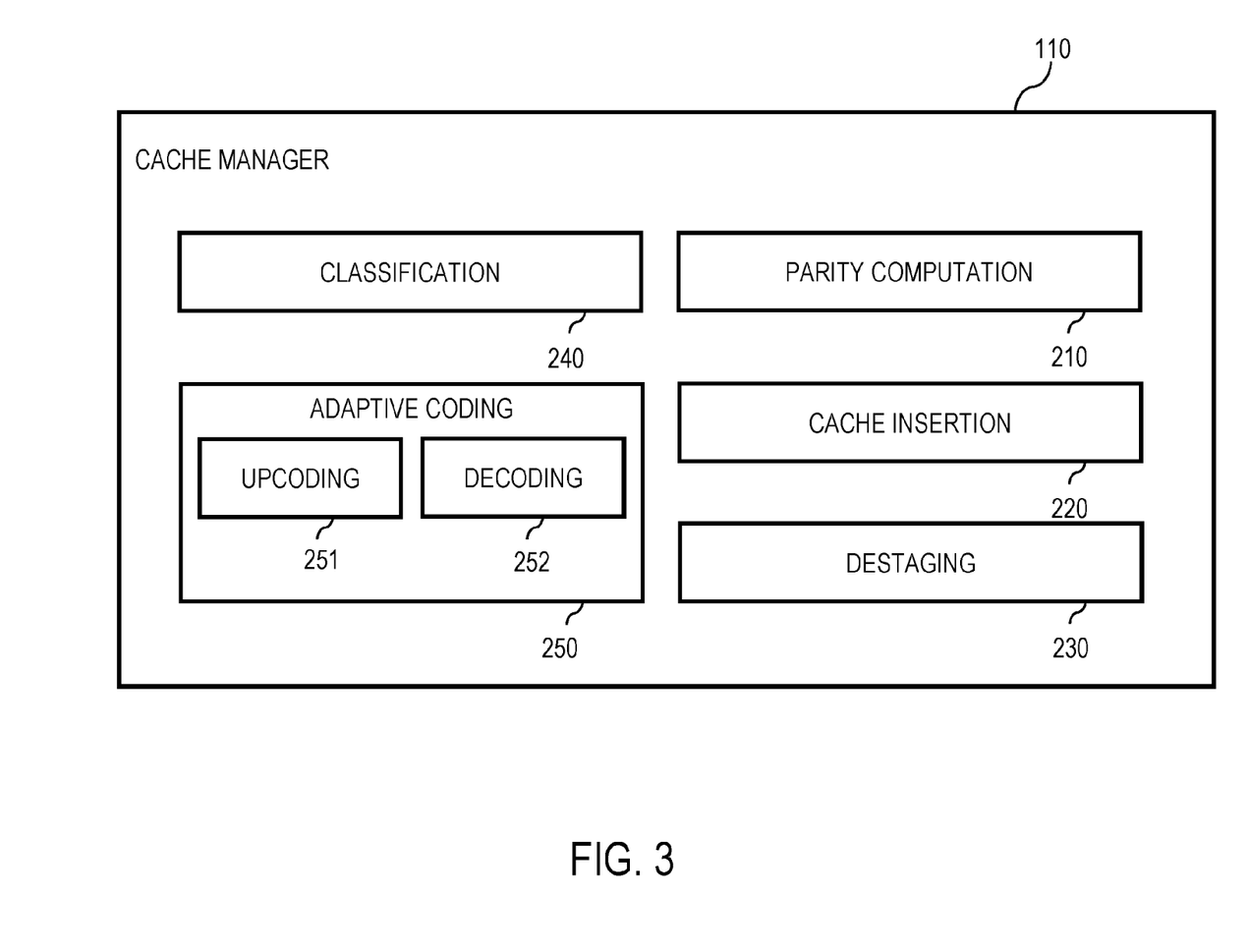
FIG. 3 illustrates the cache manager in detail, in accordance with an embodiment of the invention.

FIG. 3 illustrates the cache manager 110 in detail, in accordance with an embodiment of the invention. The cache manager 110 comprises a parity computation unit 210 configured to compute one or more parity blocks 132 for one or more stripes 130. The cache manager 110 further comprises a cache insertion unit 220 configured to insert one or more blocks (e.g., one or more data blocks 131 and one or more corresponding parity blocks 132) into the data cache 120. The cache manager 110 further comprises a destaging unit 230 configured to: (1) monitor a cache capacity (i.e., cache space usage) of the data cache 120, (2) in response to the cache capacity exceeding pre-determined bound/threshold, trigger a destaging of at least one data block 131 present in the data cache 120, and (3) in response to the destaging, generate at least one backup copy of the at least one data block 131, wherein the at least one backup copy generated is for storage on the storage back-end device 60.

Each data block 131 has at least one property. The cache manager 110 further comprises a classification unit 240 configured to determine one or more properties of a data block 131. For example, the classification unit 240 may classify a data block 131 as: (1) a clean block or a dirty block based on whether the data block 131 has at least one backup copy maintained on the storage back-end device 60, and/or (2) a hot block or a cold block based on a number of times the data block 131 is accessed from the data cache 120.

The cache manager 110 further comprises an adaptive coding unit 250 configured to: (1) determine an appropriate erasure code for a data block 131 based on at least one property of the data block 131 and cache usage space of the data cache 120, and (2) encode the data block 131 using the erasure code determined.

The adaptive coding unit 250 is further configured to convert a data block 131 between different erasure codes using upcoding or downcoding techniques during destaging of the data block or cache insertion of the data block. The adaptive coding unit 250 includes an upcoding module 251 and a downcoding module 252 for applying upcoding and downcoding, respectively.

In one embodiment, the multiple erasure codes utilized by the cache system 100 include, but are not limited to, the following: (1) a first erasure code ("high fault tolerance erasure code") having properties of high fault tolerance for increased data redundancy, (2) a second erasure code ("low fault tolerance erasure code") having properties of low fault tolerance for decreased data redundancy, (3) a third erasure code ("fast erasure code") having properties of decreased storage efficiency for increased recovery performance, and (4) a fourth erasure code ("compact erasure code") having properties of decreased recovery performance for increased storage efficiency (i.e., decreased storage overhead).

During cache insertion of at least one new data block 131 into the data cache 120, the adaptive coding unit 250 encodes the at least one new data block 131 with the high fault tolerance erasure code for increased data redundancy in the data cache 120. The cache insertion unit 220 inserts the at least one new data block 131 encoded with the high fault tolerance erasure code into the data cache 120.

During cache insertion of at least one data block 131 classified as dirty (i.e., no backup copy) into the data cache 120, the adaptive coding unit 250 encodes the at least one data block 131 with the high fault tolerance erasure code for increased data redundancy in the data cache 120. The cache insertion unit 220 inserts the at least one data block 131 encoded with the high fault tolerance erasure code into the data cache 120.

In response to the cache capacity of the data cache 120 exceeding the pre-determined bound/threshold, the destaging unit 230 triggers a destaging of at least data block 131 having the following properties: (1) the at least one data block 131 is dirty (i.e., no backup copy), (2) the at least one data block 131 is relatively cold (i.e., infrequently accessed), and (3) the at least one data block 131 is encoded with the high fault tolerance erasure code. In response to the destaging of the at least one data block 131, the adaptive coding unit 250 converts the at least one data block 131 to the low fault tolerance erasure code for decreased data redundancy in the data cache 120, as the at least one data block 131 becomes clean when destaged (i.e., at least one backup copy generated during the destaging). The decreased data redundancy helps reduce cache space usage of the data cache 120.

In one embodiment, during destaging of at least one data block 131, the adaptive coding unit 250 determines whether an erasure code that the at least one data block 131 is encoded with is the same as an erasure code utilized by the storage back-end device 60. If the same erasure code is utilized, the adaptive coding unit 250 forwards to the storage back-end device 60 each parity block 132 corresponding to the at least one data block 131, thereby removing the need to re-compute parity for the at least one data block 131 at the storage back-end device 60.

In one embodiment, if the storage back-end device 60 has slower processing facilities, at least one backup copy of at least one data block 131 may be encoded at the cache system 100 itself before the at least one backup copy is forwarded to the storage back-end device 60.

The adaptive coding unit 250 is further configured to: (1) encode at least one data block 131 classified as hot (i.e., frequently accessed) and clean (i.e., has at least one backup copy) with the fast erasure code, and (2) encode at least one data block 131 classified as cold (i.e., infrequently accessed) and clean (i.e., has at least one backup copy) with the compact erasure code.

The adaptive coding unit 250 is further configured to: (1) monitor a data temperature of a data block 131 present in the data cache 120, and (2) convert the data block 131 to a different erasure code when the data temperature changes. For examples, if at least one data block 131 classified as clean (i.e., has at least one backup copy) becomes hot with new accesses (i.e., becomes frequently accessed), the adaptive coding unit 150 converts the at least one data block 131 to the fast erasure code (i.e., downcoding to the fast erasure code) to minimize traffic bandwidth (i.e., number of network transfers) during recovery for reconstruction of a lost/missing data block 131 from a parity block 132 upon failure.

In response to the cache capacity of the data cache 120 exceeding the pre-determined bound/threshold, the adaptive coding unit 250 is further configured to convert at least one data block 131 classified as clean (i.e., has at least one backup copy) and encoded with the fast erasure code to the compact erasure code (i.e., upcoding to the compact erasure code) to reduce cache space usage of the data cache 120, thereby reclaiming cache capacity for absorbing new cache insertions.

In one embodiment, at least one data block 131 classified as clean (i.e., has at least one backup copy) may be stored in the data cache 120 without any data redundancy.

Figure 4:
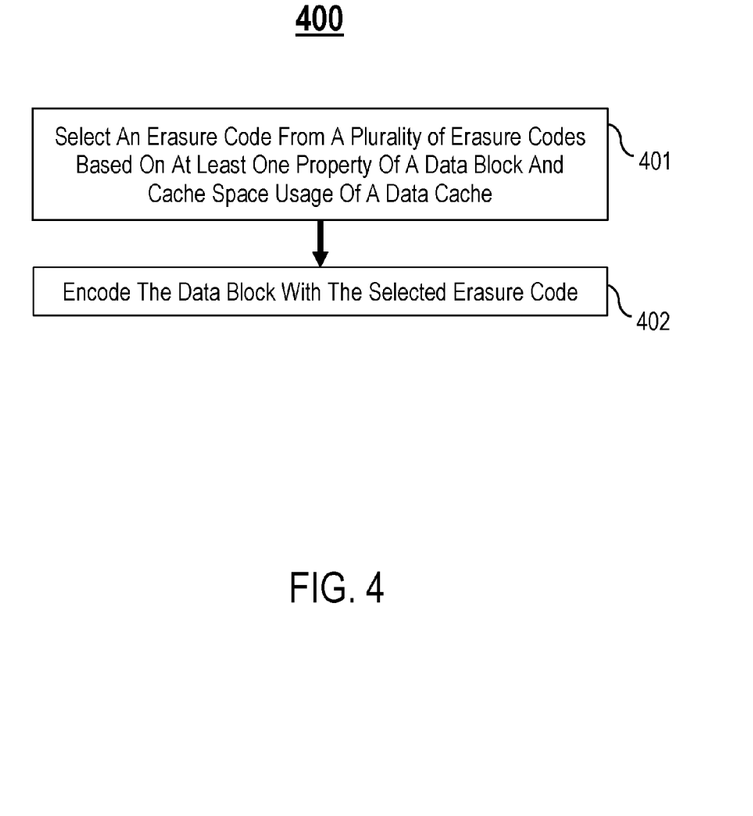
FIG. 4 illustrates a flowchart of an example process implemented by a cache system utilizing multiple erasure codes, in accordance with an embodiment of the present invention.

FIG. 4 illustrates a flowchart of an example process 400 implemented by a cache system utilizing multiple erasure codes, in accordance with an embodiment of the present invention. In process block 401, select an erasure code from a plurality of erasure codes based on at least one property of a data block and cache space usage of a data cache (e.g., the data cache 120). In process block 402, encode the data block with the selected erasure code. In one embodiment, process blocks 401-402 may be performed by the adaptive coding unit 250 and the classification unit 240.

Figure 5:
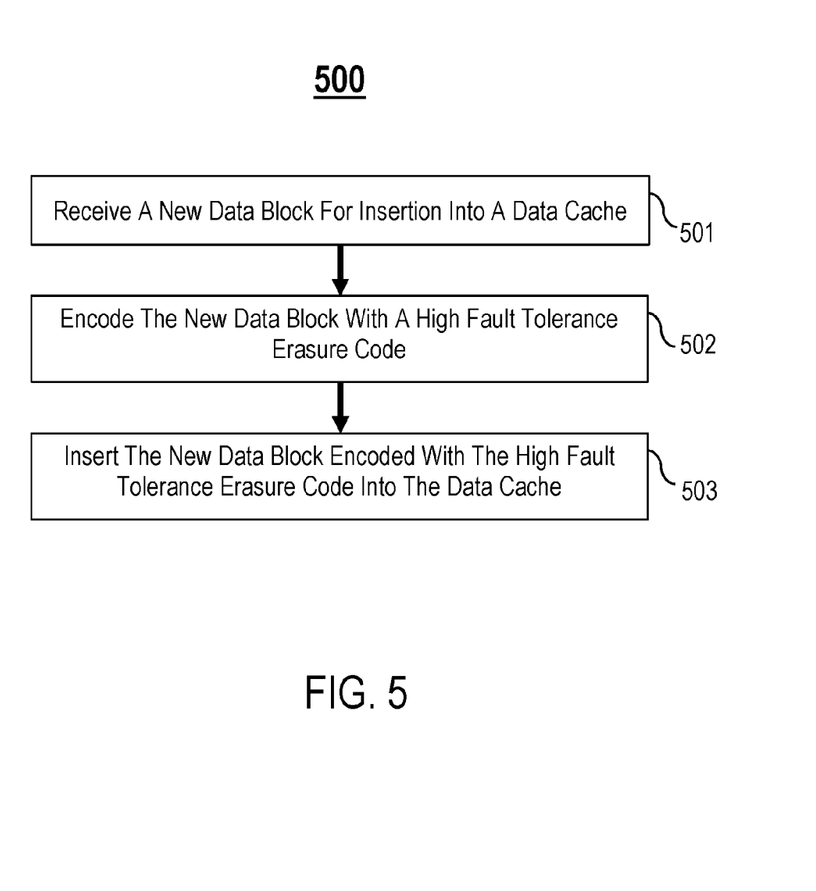
FIG. 5 illustrates a flowchart of an example process implemented by a cache system utilizing multiple erasure codes during cache insertion of a new data block, in accordance with an embodiment of the present invention.

FIG. 5 illustrates a flowchart of an example process 500 implemented by a cache system utilizing multiple erasure codes during cache insertion of a new data block, in accordance with an embodiment of the present invention. In process block 501, receive a new data block for insertion into a data cache (e.g., the data cache 120). In process block 502, encode the new data block with a high fault tolerance erasure code. In process block 503, insert the new data block encoded with the high fault tolerance erasure code into the data cache. In one embodiment, process blocks 501-503 may be performed by the adaptive coding unit 250 and the cache insertion unit 220.

Figure 6:
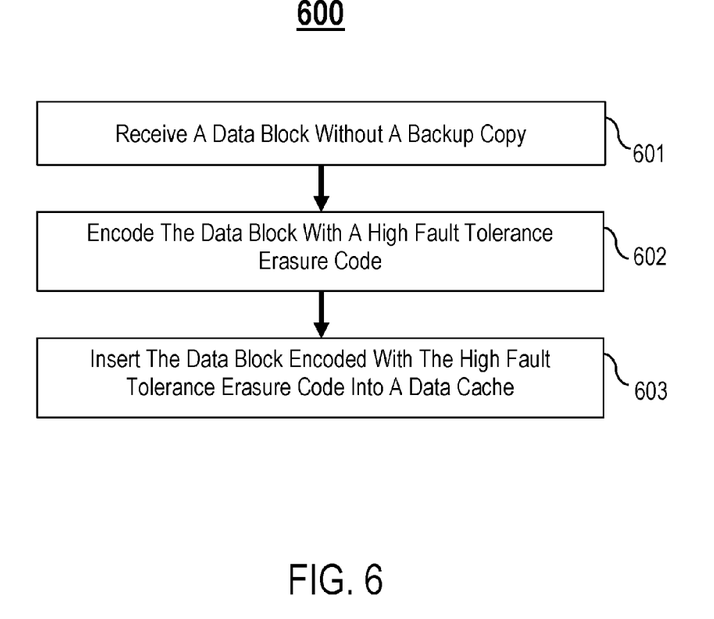
FIG. 6 illustrates a flowchart of an example process implemented by a cache system utilizing multiple erasure codes during cache insertion of a data block without a backup copy, in accordance with an embodiment of the present invention.

FIG. 6 illustrates a flowchart of an example process 600 by a cache system utilizing multiple erasure codes during cache insertion of a data block without a backup copy, in accordance with an embodiment of the present invention. In process block 601, receive a data block without a backup copy. In process block 602, encode the data block with a high fault tolerance erasure code. In process block 603, insert the data block encoded with the high fault tolerance erasure code into a data cache (e.g., the data cache 120). In one embodiment, process blocks 601-603 may be performed by the adaptive coding unit 250 and the cache insertion unit 220.

Figure 7:
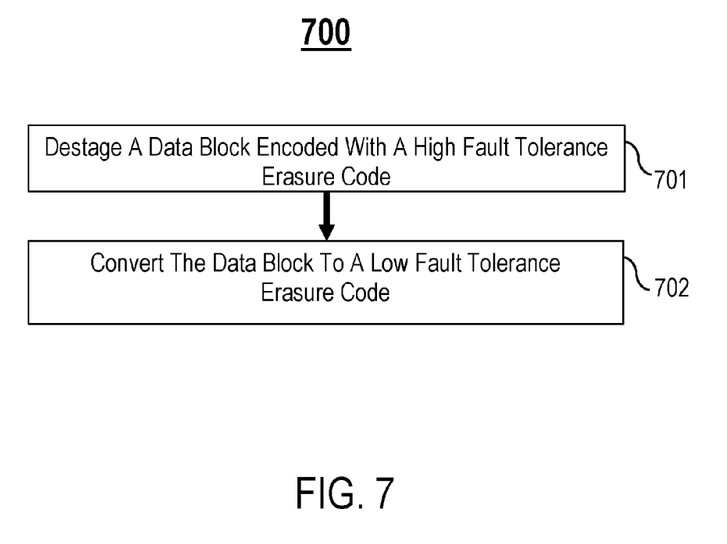
FIG. 7 illustrates a flowchart of an example process implemented by a cache system utilizing multiple erasure codes during destaging of a data block, in accordance with an embodiment of the present invention.

FIG. 7 illustrates a flowchart of an example process 700 implemented by a cache system utilizing multiple erasure codes during destaging of a data block, in accordance with an embodiment of the present invention. In process block 701, destage a data block encoded with a high fault tolerance erasure code. In process block 702, convert the data block to a low fault tolerance erasure code. In one embodiment, process blocks 701-702 may be performed by the adaptive coding unit 250 and the destaging unit 230.

Figure 8:
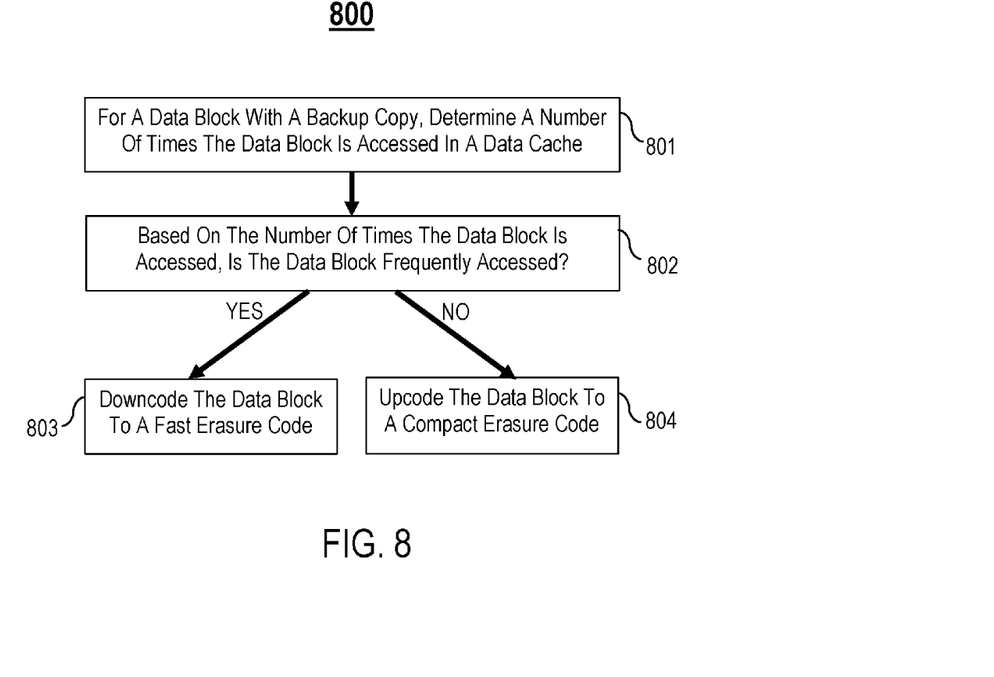
FIG. 8 illustrates a flowchart of an example process implemented by a cache system utilizing multiple erasure codes in response to a change in data temperature of a data block, in accordance with an embodiment of the present invention.

FIG. 8 illustrates a flowchart of an example process 800 implemented by a cache system utilizing multiple erasure codes in response to a change in data temperature of a data block, in accordance with an embodiment of the present invention. In process block 801, for a data block with a backup copy, determine a number of times the data block is accessed in a data cache. In process block 802, based on the number of times the data block is accessed, determine whether the data block is frequently accessed. If the data block is frequently accessed, proceed to process block 803 where the data block is downcoded to a fast erasure code. If the data block is not frequently accessed, proceed to process block 804 where the data block is upcoded to a compact erasure code. In one embodiment, process blocks 801-804 may be performed by the adaptive coding unit 250 and the classification unit 240.

Figure 9:
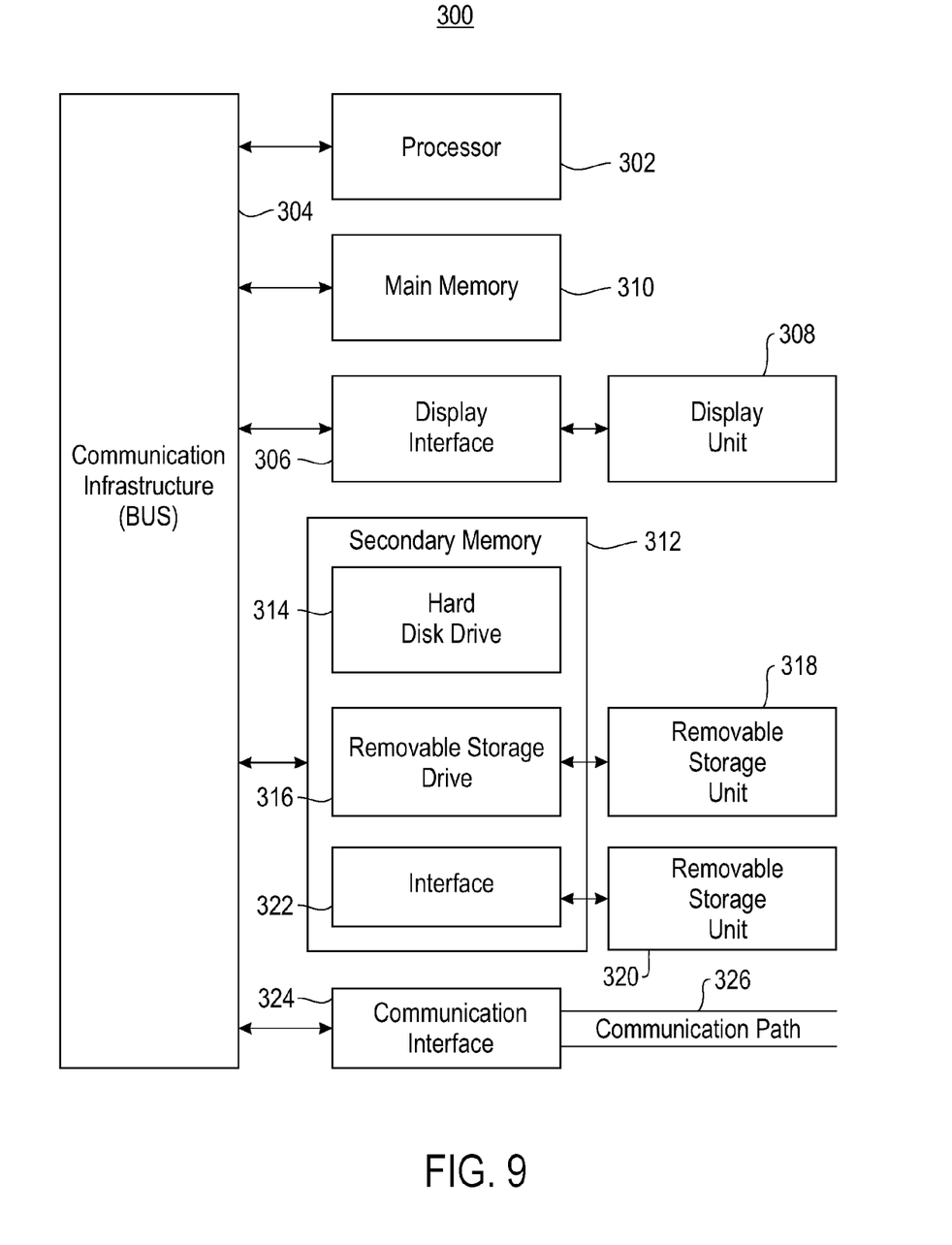
FIG. 9 is a high level block diagram showing an information processing system useful for implementing an embodiment of the present invention.

FIG. 9 is a high level block diagram showing an information processing system 300 useful for implementing one embodiment of the invention. The computer system includes one or more processors, such as processor 302. The processor 302 is connected to a communication infrastructure 304 (e.g., a communications bus, cross-over bar, or network).

The computer system can include a display interface 306 that forwards graphics, text, and other data from the communication infrastructure 304 (or from a frame buffer not shown) for display on a display unit 308. The computer system also includes a main memory 310, preferably random access memory (RAM), and may also include a secondary memory 312. The secondary memory 312 may include, for example, a hard disk drive 314 and/or a removable storage drive 316, representing, for example, a floppy disk drive, a magnetic tape drive, or an optical disk drive. The removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc. which is read by and written to by removable storage drive 316. As will be appreciated, the removable storage unit 318 includes a computer readable medium having stored therein computer software and/or data.

In alternative embodiments, the secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM, or PROM) and associated socket, and other removable storage units 320 and interfaces 322, which allows software and data to be transferred from the removable storage unit 320 to the computer system.

The computer system may also include a communication interface 324. Communication interface 324 allows software and data to be transferred between the computer system and external devices. Examples of communication interface 324 may include a modem, a network interface (such as an Ethernet card), a communication port, or a PCMCIA slot and card, etc. Software and data transferred via communication interface 324 are in the form of signals which may be, for example, electronic, electromagnetic, optical, or other signals capable of being received by communication interface 324. These signals are provided to communication interface 324 via a communication path (i.e., channel) 326. This communication path 326 carries signals and may be implemented using wire or cable, fiber optics, a phone line, a cellular phone link, an RF link, and/or other communication channels.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

From the above description, it can be seen that the present invention provides a system, computer program product, and method for implementing the embodiments of the invention. The present invention further provides a non-transitory computer-useable storage medium for implementing the embodiments of the invention. The non-transitory computer-useable storage medium has a computer-readable program, wherein the program upon being processed on a computer causes the computer to implement the steps of the present invention according to the embodiments described herein. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   at a cache system supporting a plurality of erasure codes with different reliability and storage overhead requirements:
   adaptively coding at least one data block by:
      selecting an erasure code from the plurality of erasure codes based on at least one property of the at least one data block and information relating to a data cache of the cache system, wherein the information relating to the data cache includes cache space usage of the data cache; and
      encoding, utilizing at least one hardware processor, the at least one data block with the selected erasure code, wherein the encoded at least one data block is inserted into the data cache, and the encoded at least one data block results in one of increased recovery performance in the data cache, increased data redundancy in the data cache, or decreased storage overhead in the data cache.

2. The method of claim 1, wherein the at least one property indicates at least one of the following: whether the at least one data block has at least one backup copy maintained on at least one hardware storage back-end device, and a number of times the at least one data block is accessed from the data cache.

3. The method of claim 1, wherein the encoded at least one data block is inserted into a hardware cache of the data cache.

4. The method of claim 1, wherein the plurality of erasure codes comprise at least one of the following: a high fault tolerance erasure code that increases data redundancy in the data cache, a low fault tolerance erasure code that decreases data redundancy in the data cache, a fast erasure code that increases recovery performance in the data cache, and a compact erasure code that decreases storage overhead in the data cache.

5. The method of claim 1, the method further comprising:
   for at least one new data block for insertion into the data cache:
      encoding the at least one new data block with a high fault tolerance erasure code that increases data redundancy in the data cache; and
      inserting the at least one new data block encoded with the high fault tolerance erasure code into the data cache.

6. The method of claim 2 the method further comprising:
   in response to determining, based on the at least one property, the at least one data block does not have at least one backup copy maintained on at least one hardware storage back-end device:
      encoding the at least one data block with a high fault tolerance erasure code that increases data redundancy in the data cache; and
      inserting the at least one data block encoded with the high fault tolerance erasure code into the data cache.

7. The method of claim 1, the method further comprising:
   in response to destaging of at least one additional data block encoded with a high fault tolerance erasure code that increases data redundancy in the data cache:
      converting the at least one additional data block to a low fault tolerance erasure code that decreases data redundancy in the data cache.

8. The method of claim 2, the method further comprising:
   in response to determining, based on the at least one property, the at least one data block does have at least one backup copy maintained on at least one hardware storage back-end device:
      determining whether the at least one data block is a hot block based on the number of times the at least one data block is accessed in the data cache; and
      in response to determining the at least one data block is not a hot block, reclaiming cache space of the data cache by upcoding the at least one data block to a compact erasure code that decreases storage overhead in the data cache.

9. The method of claim 2, the method further comprising:
   in response to determining, based on the at least one property, the at least one data block does have at least one backup copy maintained on at least one hardware storage back-end device:

determining whether the at least one data block is a hot block based on the number of times the at least one data block is accessed in the data cache; and in response to determining the at least one data block is a hot block, minimizing traffic bandwidth during recovery by downcoding the at least one data block to a fast erasure code that increases recovery performance in the data cache.

10. The method of claim 2, the method further comprising:

for the at least one data block:

determining whether the number of times the at least one data block is accessed in the data cache has increased; and in response to determining the number of times the at least one data block is accessed in the data cache has increased, minimizing traffic bandwidth during recovery by converting the at least one data block to a fast erasure code that increases recovery performance in the data cache.

11. The method of claim 1, the method further comprising:

in response to destaging of at least one additional data block:

determining whether a first erasure code that the at least one additional data block is encoded with is the same as a second erasure code utilized at a hardware storage back-end device; and in response to determining that the first erasure code and the second erasure code are the same, destaging at least one parity block corresponding to the at least one additional data block.

12. A system comprising a computer processor, a computer-readable hardware storage device, and program code embodied with the computer-readable hardware storage device for execution by the computer processor to implement a method comprising:

at a cache system supporting a plurality of erasure codes with different reliability and storage overhead requirements:

adaptively coding at least one data block by:

selecting an erasure code from the plurality of erasure codes based on at least one property of the at least one data block and information relating to a data cache of the cache system, wherein the information relating to the data cache includes cache space usage of the data cache; and encoding, utilizing at least one hardware processor, the at least one data block with the selected erasure code, wherein the encoded at least one data block is inserted into the data cache, and the encoded at least one data block results in one of increased recovery performance in the data cache, increased data redundancy in the data cache, or decreased storage overhead in the data cache.

13. The system of claim 12, wherein the at least one property indicates at least one of the following:

whether the at least one data block has at least one backup copy maintained on at least one hardware storage back-end device, and a number of times the at least one data block is accessed from the data cache.

14. The system of claim 13, wherein the plurality of erasure codes comprise at least one of the following: a high fault tolerance erasure code that increases data redundancy in the data cache, a low fault tolerance erasure code that decreases data redundancy in the data cache, a fast erasure code that increases recovery performance in the data cache, and a compact erasure code that decreases storage overhead in the data cache.

15. The system of claim 14, wherein the method further comprises:

for at least one new data block for insertion into the data cache:

encoding the at least one new data block with a high fault tolerance erasure code that increases data redundancy in the data cache; and inserting the at least one new data block encoded with the high fault tolerance erasure code into the data cache.

16. The system of claim 14, wherein the method further comprises:

in response to determining, based on the at least one property, the at least one data block does not have at least one backup copy maintained on at least one hardware storage back-end device:

encoding the at least one data block with a high fault tolerance erasure code that increases data redundancy in the data cache; and inserting the at least one data block encoded with the high fault tolerance erasure code into the data cache.

17. The system of claim 14, wherein the method further comprises:

in response to destaging of at least one additional data block encoded with a high fault tolerance erasure code that increases data redundancy in the data cache:

converting the at least one additional data block to a low fault tolerance erasure code that decreases data redundancy in the data cache.

18. The system of claim 14, wherein the method further comprises:

in response to determining, based on the at least one property, the at least one data block does have at least one backup copy maintained on at least one hardware storage back-end device:

determining whether the at least one data block is a hot block based on the number of times the at least one data block is accessed in the data cache;

in response to determining the at least one data block is not a hot block, reclaiming cache space of the data cache by upcoding the at least one data block to a compact erasure code that decreases storage overhead in the data cache; and in response to determining the at least one data block is a hot block, minimizing traffic bandwidth during recovery by downcoding the at least one data block to a fast erasure code that increases recovery performance in the data cache.

19. The system of claim 12, wherein the method further comprises:

in response to destaging of at least one additional data block:

determining whether a first erasure code that the at least one additional data block is encoded with is the same as a second erasure code utilized at a hardware storage back-end device; and in response to determining that the first erasure code and the second erasure code are the same, destaging at least one parity block corresponding to the at least one additional data block.

20. A computer program product comprising a computer-readable hardware storage medium having program code embodied therewith, the program code being executable by a computer to implement a method comprising:

at a cache system supporting a plurality of erasure codes with different reliability and storage overhead requirements:
adaptively coding at least one data block by:
selecting an erasure code from the plurality of erasure codes based on at least one property of the at least one data block and information relating to a data cache of the cache system, wherein the information relating to the data cache includes cache space usage of the data cache; and
encoding, utilizing at least one hardware processor, the at least one data block with the selected erasure code, wherein the encoded at least one data block is inserted into the data cache, and the encoded at least one data block results in one of increased recovery performance in the data cache, increased data redundancy in the data cache, or decreased storage overhead in the data cache.

* * * * *